(12) United States Patent
Ishihara et al.

(10) Patent No.: US 10,020,786 B2
(45) Date of Patent: Jul. 10, 2018

(54) POWER AMPLIFICATION MODULE

(71) Applicant: Murata Manufacturing Co., Ltd., Kyoto (JP)

(72) Inventors: Shota Ishihara, Kyoto (JP); Yusuke Shimamune, Kyoto (JP); Takashi Soga, Kyoto (JP); Fuminori Morisawa, Kyoto (JP); Seiko Ono, Kyoto (JP); Tetsuaki Adachi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/201,999

(22) Filed: Jul. 5, 2016

(65) Prior Publication Data

US 2017/0019082 A1    Jan. 19, 2017

(30) Foreign Application Priority Data

Jul. 14, 2015  (JP) .................................. 2015-140390
Dec. 17, 2015 (JP) .................................. 2015-246193

(51) Int. Cl.
| | |
|---|---|
| *G06G 7/12* | (2006.01) |
| *H03G 3/30* | (2006.01) |
| *H03F 3/19* | (2006.01) |
| *H03F 3/24* | (2006.01) |
| *H03F 1/56* | (2006.01) |

(52) U.S. Cl.
CPC .......... *H03G 3/3042* (2013.01); *H03F 1/565* (2013.01); *H03F 3/19* (2013.01); *H03F 3/245* (2013.01); *H03G 3/3047* (2013.01); *H03F 2200/102* (2013.01); *H03F 2200/222* (2013.01); *H03F 2200/318* (2013.01); *H03F 2200/387* (2013.01); *H03F 2200/408* (2013.01); *H03F 2200/451* (2013.01); *H03G 2201/40* (2013.01)

(58) Field of Classification Search
None
See application file for complete search history.

(56) References Cited

U.S. PATENT DOCUMENTS

| | | | |
|---|---|---|---|
| 7,605,651 | B2 | 10/2009 | Ripley |
| 2011/0032038 | A1 | 2/2011 | Shimamoto |
| 2012/0306579 | A1* | 12/2012 | Okamura ............. H03F 1/0261 330/296 |

(Continued)

FOREIGN PATENT DOCUMENTS

| | | |
|---|---|---|
| JP | 2000-013250 A | 1/2000 |
| JP | 2005-020383 A | 1/2005 |

(Continued)

*Primary Examiner* — Long Nguyen
(74) *Attorney, Agent, or Firm* — Pearne & Gordon LLP

(57) ABSTRACT

Provided is a power amplification module that includes: an amplification transistor that has a constant power supply voltage supplied to a collector thereof, a bias current supplied to a base thereof and that amplifies an input signal input to the base thereof and outputs an amplified signal from the collector thereof; a first current source that outputs a first current that corresponds to a level control voltage that is for controlling a signal level of the amplified signal; and a bias transistor that has the first current supplied to a collector thereof, a bias control voltage connected to a base thereof and that outputs the bias current from an emitter thereof.

7 Claims, 24 Drawing Sheets

(56) References Cited

U.S. PATENT DOCUMENTS

2013/0207729 A1* 8/2013 Okamura ............. H03F 1/0261
330/296
2014/0015568 A1 1/2014 Shimamune
2014/0210552 A1* 7/2014 Li ......................... H03G 3/007
330/278

FOREIGN PATENT DOCUMENTS

JP 2009-100197 A 5/2009
WO 2013/031440 A1 3/2015

* cited by examiner

POWER AMPLIFICATION MODULE

Priority is claimed from Japanese Patent Application No. 2015-246193 filed on Dec. 17, 2015 and Japanese Patent Application No. 2015-140390 filed Jul. 14, 2015. The contents of these applications are incorporated herein by reference in their entireties.

BACKGROUND

The present disclosure relates to a power amplification module.

A power amplification module is used in a mobile communication device such as a cellular phone in order to amplify the power of a radio frequency (RF) signal to be transmitted to a base station. For example, in the global system for mobile communications (GSM) (registered trademark), the gain of a power amplification module is controlled in order to realize slope control (ramp up and ramp down) for a transmission signal to be transmitted from a mobile communication device to a base station.

In Japanese Unexamined Patent Application Publication No. 2009-100197, a configuration is disclosed in which a voltage Vldo output from a low drop out (LDO) regulator is supplied to a collector terminal of each stage of a 3-stage amplifier in a power amplification module. In this configuration, the gain of the power amplification module is controlled by adjusting the level of the voltage Vldo on the basis of a level control voltage Vramp.

In addition, in U.S. Pat. No. 7,605,651, a configuration is disclosed in which a voltage Vreg output from an LDO regulator is supplied to first and second stages and a constant power supply voltage is supplied to a third stage in a power amplification module including a 3-stage amplifier.

In the configurations disclosed in Japanese Unexamined Patent Application Publication No. 2009-100197 and U.S. Pat. No. 7,605,651 described above, an LDO regulator is used in order to control the gain of a power amplification module. Generally, in order to supply a large current, the circuit scale of an LDO regulator is large.

BRIEF SUMMARY

The present disclosure was made in light of the above-described circumstances and the present disclosure suppresses an increase in the size of the circuit of a power amplification module that performs slope control on a transmission signal.

A power amplification module according to an embodiment of the present disclosure includes: an amplification transistor that has a constant power supply voltage supplied to a collector thereof, a bias current supplied to a base thereof and that amplifies an input signal input to the base thereof and outputs an amplified signal from the collector thereof; a first current source that outputs a first current that corresponds to a level control voltage that is for controlling a signal level of the amplified signal; and a bias transistor that has the first current supplied to a collector thereof, a bias control voltage connected to a base thereof and that outputs the bias current from an emitter thereof.

According to the embodiment of the present disclosure, an increase in circuit scale can be suppressed in a power amplification module that performs slope control on a transmission signal.

Other features, elements, characteristics and advantages of the present disclosure will become more apparent from the following detailed description of embodiments of the present disclosure with reference to the attached drawings.

DETAILED DESCRIPTION

Figure 1:
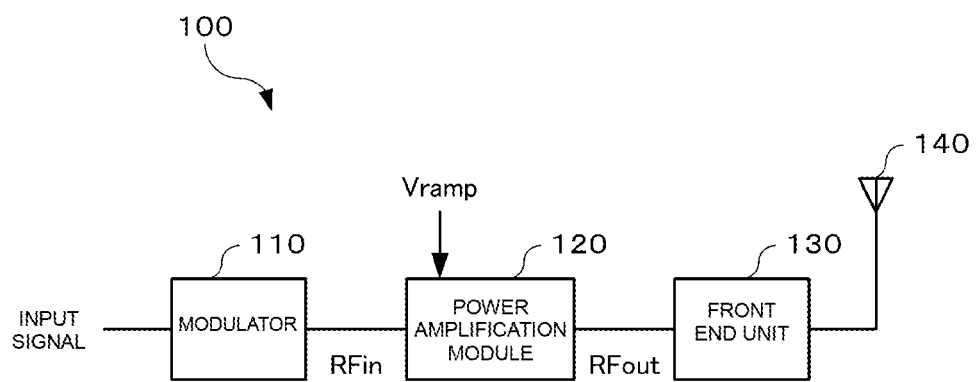
FIG. 1 illustrates an example configuration of a transmission unit that includes a power amplification module according to an embodiment of the present disclosure.

Hereafter, embodiments of the present disclosure will be described while referring to the drawings. FIG. 1 illustrates an example configuration of a transmission unit that includes a power amplification module according to an embodiment of the present disclosure. A transmission unit 100 is for example used in a mobile communication device such as a cellular phone in order to transmit various signals such as speech and data to a base station. Although such a mobile communication device would also be equipped with a reception unit for receiving signals from the base station, the description of such a reception unit is omitted here.

As illustrated in FIG. 1, the transmission unit 100 includes a modulator 110, a power amplification module 120, a front end unit 130 and an antenna 140.

The modulator 110 modulates an input signal on the basis of a modulation scheme such as GSM or enhanced data rates for GSM evolution (EDGE) and generates a radio frequency signal for performing wireless transmission. The RF signal has a frequency of around several hundred MHz to several GHz, for example.

The power amplification module 120 amplifies the power of the RF signal (RFin) up to the level that is required to transmit the RF signal to the base station, and outputs an amplified signal (RFout). In addition, the power amplification module 120 performs slope control on the amplified signal (transmission signal) by controlling the gain on the basis of a voltage Vramp (level control voltage), which is for controlling the signal level.

Figure 2:
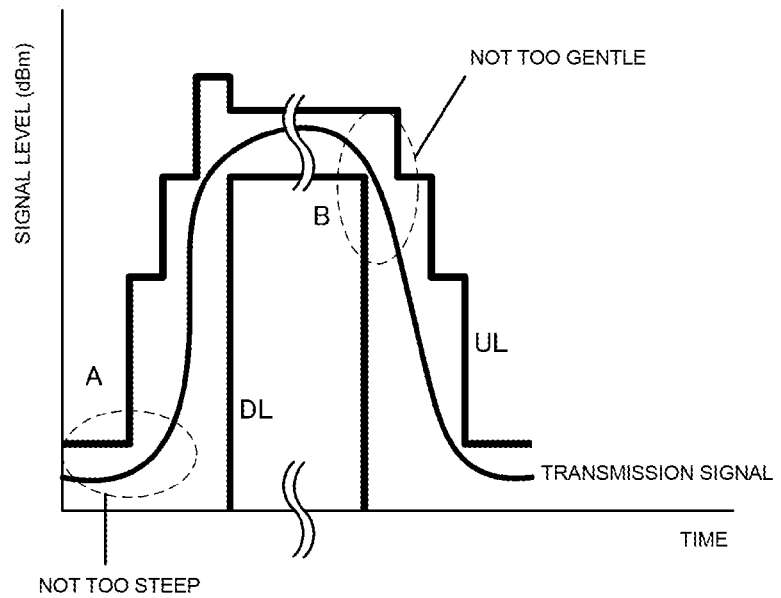
FIG. 2 illustrates an example of slope control of a transmission signal.

FIG. 2 illustrates an example of slope control of a transmission signal. As illustrated in FIG. 2, in slope control, it is necessary that the signal level of the transmission signal be controlled so as to lie within a range between a lower limit DL and an upper limit UL. In addition, it is necessary that the signal level be controlled so as to maintain a prescribed rate of change (slope) such that the signal level of the transmission signal does not exceed the upper limit UL and does not fall below the lower limit DL in a location indicated by A in FIG. 2 (rising region). In addition, it is necessary that the signal level be controlled so as to maintain a prescribed rate of change such that the signal level of the transmission signal does not exceed the upper limit UL and does not fall below the lower limit DL in a location indicated by B in FIG. 2 (falling region).

Figure 3:
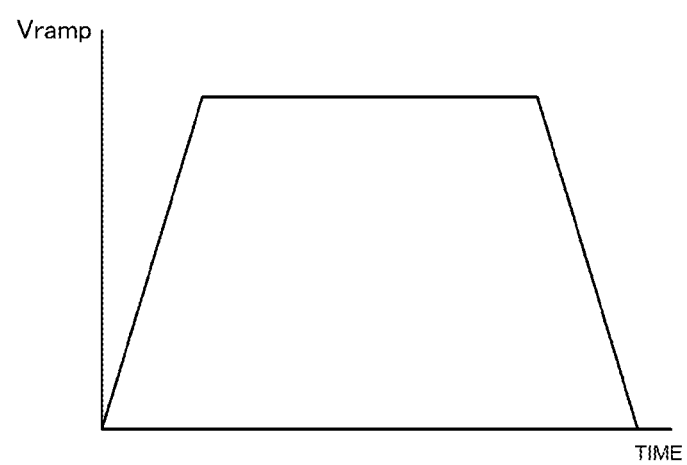
FIG. 3 illustrates an example of a voltage input to the power amplification module.

FIG. 3 illustrates an example of the voltage Vramp input to the power amplification module 120. In the power amplification module 120, the signal level of the transmission signal is controlled as illustrated in FIG. 2 by controlling the gain on the basis of the voltage Vramp, which changes as illustrated in FIG. 3.

Returning to FIG. 1, the front end unit 130 filters the amplified signal and switches a reception signal received from the base station. The amplified signal output from the front end unit 130 is transmitted to the base station via the antenna 140.

Figure 4:
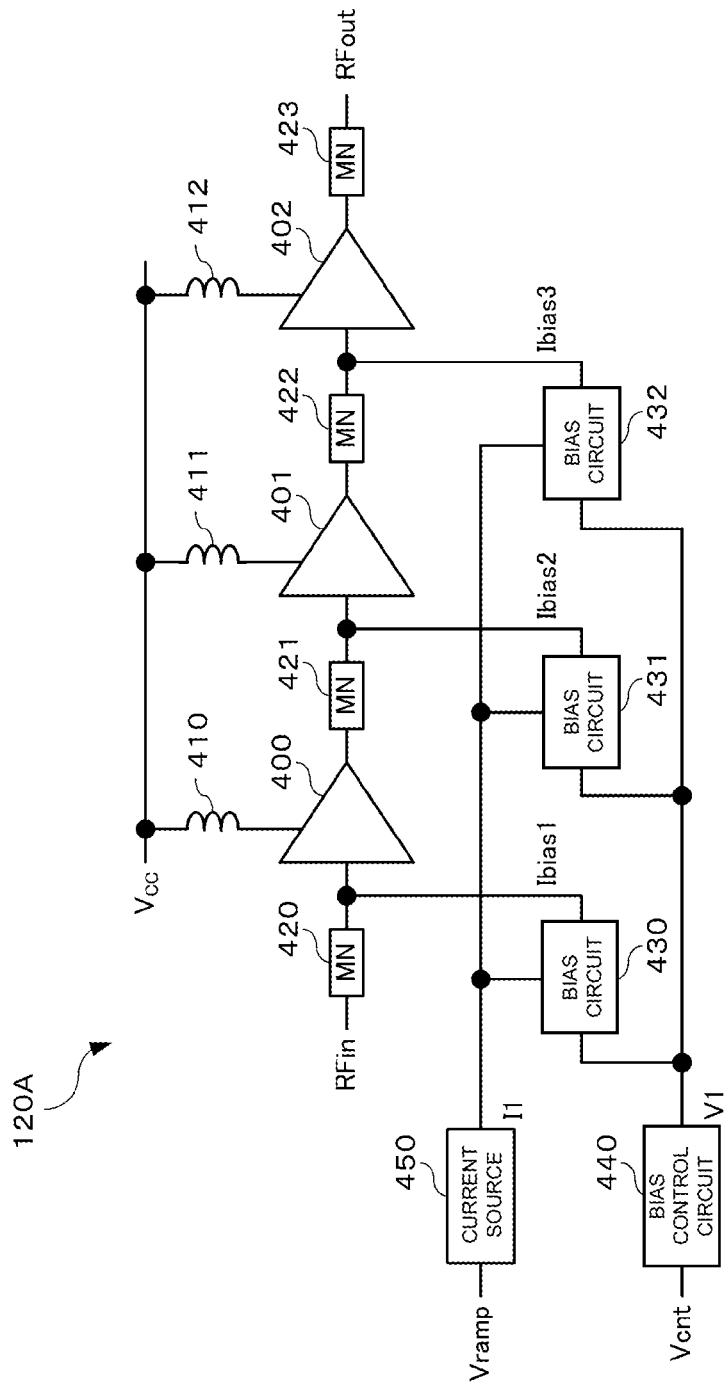
FIG. 4 illustrates the configuration of a power amplification module, which is an example of the power amplification module illustrated in FIG. 1.

FIG. 4 illustrates the configuration of a power amplification module 120A, which is an example of the power amplification module 120. The power amplification module 120A includes amplifiers 400, 401 and 402, inductors 410, 411 and 412, matching networks (MN's) 420, 421, 422 and 423, bias circuits 430, 431 and 432, a bias control circuit 440 and a current source 450.

The amplifiers 400 to 402 form a three-stage amplifier. The amplifier 400 amplifies an RF signal input thereto and outputs an amplified signal. The amplifier 401 amplifies the amplified signal (RF signal) output from the amplifier 400 and outputs an amplified signal. The amplifier 402 amplifies the amplified signal (RF signal) output from the amplifier 401 and outputs an amplified signal. A constant power supply voltage Vcc is supplied to the amplifier 400. In addition, a bias current Ibias1 is supplied from the bias circuit 430 to the amplifier 400. Similarly, the power supply voltage Vcc and a bias current Ibias2 are supplied to the amplifier 401. The power supply voltage Vcc and a bias current Ibias3 are supplied to the amplifier 402. The number of stages of the amplifier is not limited to three and may be two or less or four or more.

Figure 5:
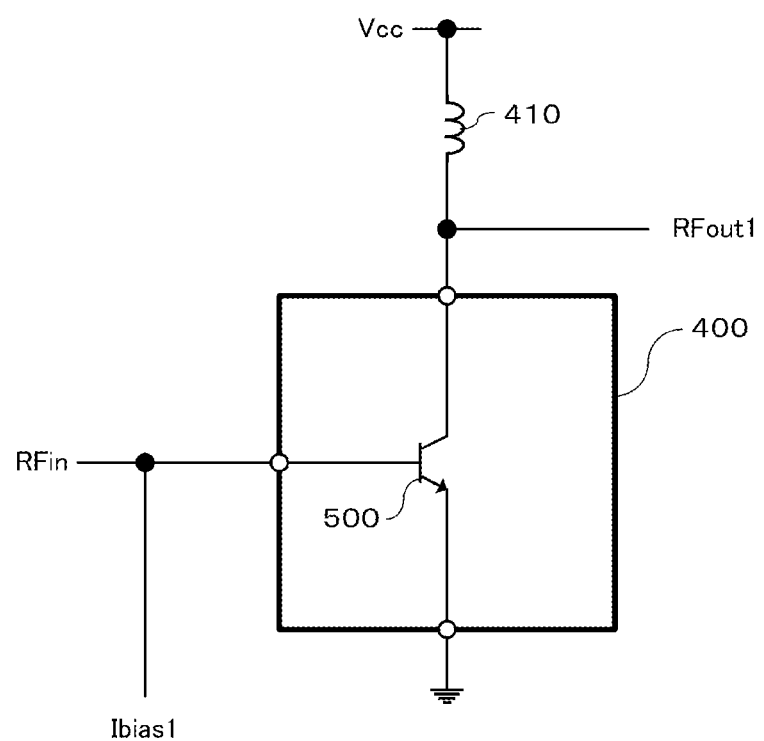
FIG. 5 illustrates an example of the configuration of an amplifier.

FIG. 5 illustrates an example of the configuration of the amplifier 400. As illustrated in FIG. 5, the amplifier 400 includes a transistor 500 (amplification transistor). The transistor 500 is a heterojunction bipolar transistor (HBT), for example. The power supply voltage Vcc is supplied to the collector of the transistor 500 via the inductor 410. The RF signal (RFin) is input to the base of the transistor 500. In addition, the bias current Ibias1 is supplied to the base of the transistor 500. The transistor 500 has a common emitter. An amplified signal (RFout1) is output from the collector of the transistor 500. The amplifiers 401 and 402 have a similar configuration.

As illustrated in FIG. 5, the gain is controlled in the amplifier 400 by using the bias current Ibias1. Although a configuration can also be considered in which the gain is controlled by using a bias voltage instead of the bias current, there is better controllability with the bias current. This will be explained below. Ic represents the collector current, Vb the base voltage, Ib the base current, hFE the current amplification factor, Is the saturation current, k the Boltzmann coefficient, T the absolute temperature, q the elemental charge of an electron and Vt the thermal voltage=k×T/q. In the case of control using on the base voltage, $\Delta Ic \approx Is \times \exp(\Delta Vb/Vt)$. Therefore, controllability is poor since the collector current Ic rapidly rises when the base voltage Vb exceeds a threshold voltage. On the other hand, in the case of control using the base current, $\Delta Ic = \Delta Ib \times hFE$. Therefore, controllability is good since the rate of change of the collector current Ic is constant with respect to the base current Ib.

Returning to FIG. 4, the matching networks 420 to 423 are provided in front of and behind the amplifiers 400 to 402. The matching networks 420 to 423 are circuits for matching impedances between the circuits. The matching networks 420 to 423 are formed using capacitors and inductors, for example.

The bias circuits 430 to 432 supply the bias currents Ibias1 to Ibias3 to the amplifiers 400 to 402. The bias currents Ibias1 to Ibias3 are adjusted on the basis of a bias control voltage V1 output from the bias control circuit 440 and a current I1 output from the current source 450.

Figure 6:
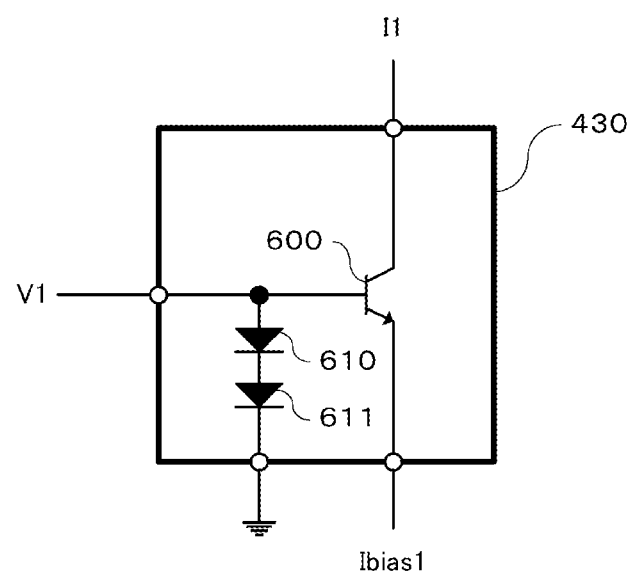
FIG. 6 illustrates an example of the configuration of a bias circuit.

FIG. 6 illustrates an example of the configuration of the bias circuit 430. The bias circuit 430 includes a transistor 600 and diodes 610 and 611. The transistor 600 (bias transistor) is an HBT, for example. The diodes 610 and 611 are connected in series with each other, the anode of the diode 610 is connected to the base of the transistor 600 and the cathode of the diode 611 is grounded. The bias control voltage V1 is supplied to the base of the transistor 600. In addition, the current I1 is supplied to the collector of the transistor 600. The bias current Ibias1 is output from the emitter of the transistor 600. The bias circuits 431 and 432 have a similar configuration. Transistors, which each have the collector and the base thereof connected to each other (diode connected), may be used instead of the diodes 610 and 611.

Returning to FIG. 4, the bias control circuit 440 outputs the bias control voltage V1 on the basis of a control voltage Vcnt. The bias control voltage V1 is constant while the transmission signal is subjected to slope control.

The current source 450 (first current source) outputs the current I1 (first current) on the basis of the voltage Vramp. In the power amplification module 120A, the current I1 is controlled in accordance voltage Vramp and as a result the gains of the amplifiers 400 to 402 are controlled. The transmission signal is subjected to slope control as a result of the gains of the amplifiers 400 to 402 being controlled.

Figure 7:
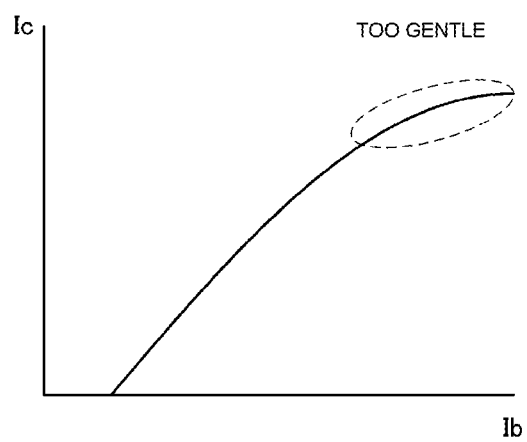
FIG. 7 illustrates an example of the relationship between a base current and a collector current in a transistor.

As illustrated in FIG. 2, in the slope control, it is necessary that the change in the signal level not be too gentle when the signal level is falling (that is, in region where signal level is high). FIG. 7 illustrates an example of the relationship between the base current Ib and the collector current Ic in a transistor. As illustrated in FIG. 7, the change in the collector current Ic becomes gentle in a saturation region of the transistor. The characteristic illustrated in FIG. 7 is the same as in the transistors forming the amplifiers 400 to 402. Therefore, in the amplifiers 400 to 402, it is necessary to increase the rate of change of the bias currents Ibias (make the slopes steeper) in a region where the voltage Vramp is large as exemplified in FIG. 8 in order to ensure that the change in the signal level is not too gentle in the region where the signal level is high. The current source 450 controls the current I1 in order that the bias currents Ibias change in this way.

Figure 9:
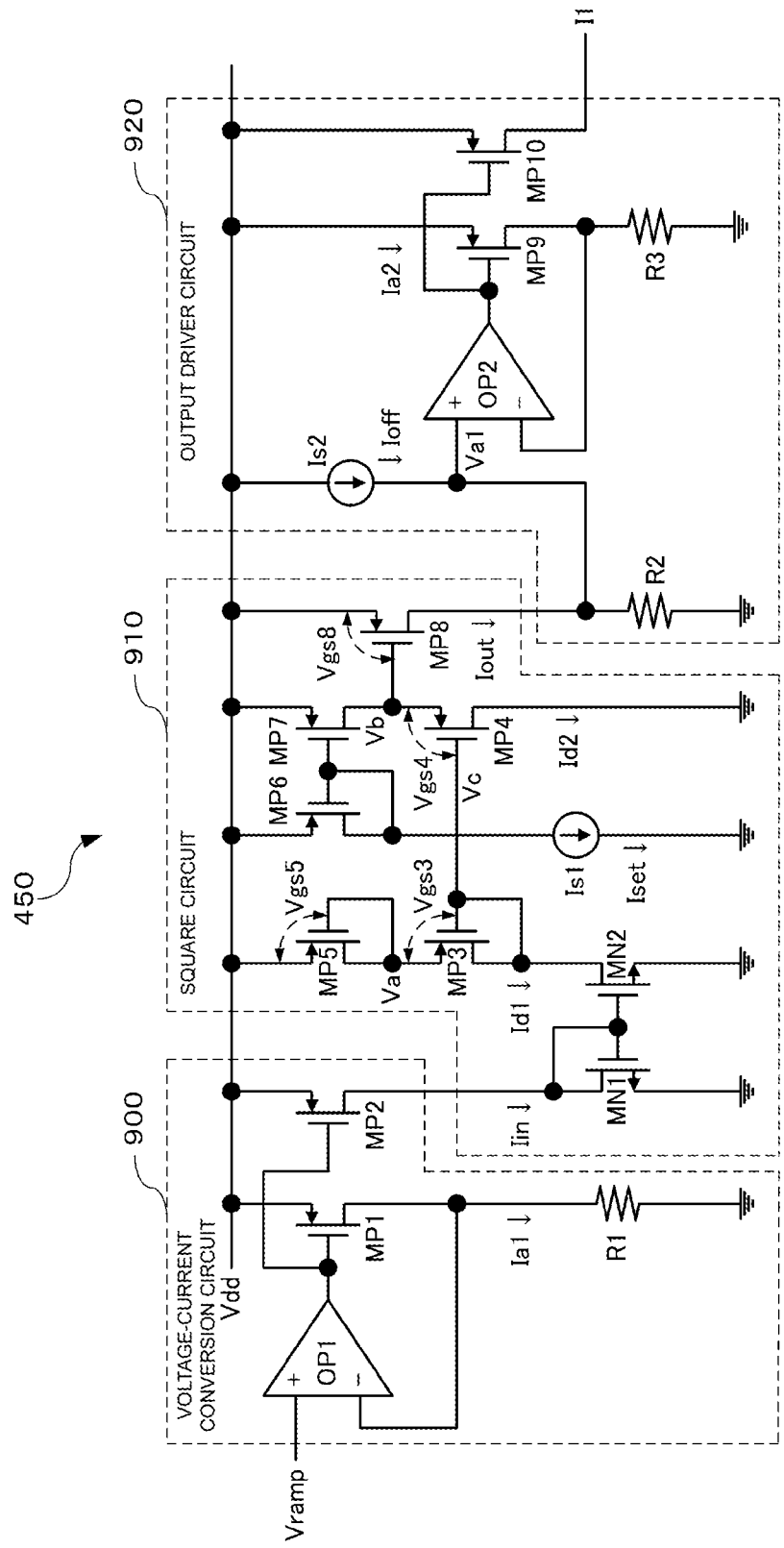
FIG. 9 illustrates an example of the configuration of a current source.

FIG. 9 illustrates an example of the configuration of the current source 450. The current source 450 includes operational amplifiers OP1 and OP2, p-channel MOSFETs (MP1, MP2, MP3, MP4, MP5, MP6, MP7, MP8, MP9 and MP10), n-channel MOSFETs (MN1 and MN2), current sources Is1 and Is2 and resistors R1, R2 and R3.

The operational amplifier OP1, the p-channel MOSFETs (MP1 and MP2) and the resistor R1 form a voltage-current conversion circuit 900 that converts the voltage Vramp into a current Iin.

The operational amplifier OP1 has the voltage Vramp supplied to a non-inverting input terminal thereof, an inverting input terminal thereof is connected to the drain of the p-channel MOSFET (MP1) and an output terminal thereof is connected to the gate of the p-channel MOSFET (MP1). The p-channel MOSFET (MP1) has a power supply voltage Vdd supplied to the source thereof and the drain thereof is connected to a first terminal of the resistor R1. A second terminal of the resistor R1 is grounded. The p-channel MOSFET (MP2) has the power supply voltage Vdd supplied to the source thereof, the gate thereof is connected to the gate of the p-channel MOSFET (MP1) and the drain thereof is connected to the drain of the n-channel MOSFET (MN1).

The voltage at the first terminal of the resistor R1 is the voltage Vramp due to an imaginary short between the non-inverting input terminal and the inverting input terminal of the operational amplifier OP1. If we denote the resistance value of the resistor R1 as R1, a current Ia1 that flows to the p-channel MOSFET (MP1) is Vramp/R1. Then, since the p-channel MOSFETs (MP1 and MP2) are connected in a current mirroring manner, a current Iin output from the p-channel MOSFET (MP2) has a value that corresponds to the voltage Vramp.

The n-channel MOSFETs (MN1 and MN2), the p-channel MOSFETs (MP3 to MP8) and the current source Is1 form a square circuit 910 that outputs a current Iout that changes in a substantially square relationship with respect to the current Iin.

The n-channel MOSFET (MN1) has the drain thereof connected to the drain of the p-channel MOSFET (MP2), the gate thereof connected to the drain thereof and has a common source. The n-channel MOSFET (MN2) has the drain thereof connected to the drain of the p-channel MOSFET (MP3), the gate thereof connected to the gate of the n-channel MOSFET (MN1) and has a common source.

The p-channel MOSFET (MP5) has the power supply voltage Vdd supplied to the source thereof, has the gate thereof connected to the drain thereof and has the drain thereof connected to the source of the p-channel MOSFET (MP3). The p-channel MOSFET (MP3) has the gate thereof connected to the drain thereof and has the drain thereof connected to the drain of the n-channel MOSFET (MN2).

The p-channel MOSFET (MP6) has the power supply voltage Vdd supplied to the source thereof, has the gate thereof connected to the drain thereof and has the drain thereof connected to the current source Is1. The current source Is1 outputs a constant current Iset. The p-channel MOSFET (MP7) has the power supply voltage Vdd supplied to the source thereof, has the gate thereof connected to the gate of the p-channel MOSFET (MP6) and has the drain thereof connected to the source of the p-channel MOSFET (MP4). The p-channel MOSFET (MP4) has the gate thereof connected to the gate of the p-channel MOSFET (MP3) and has a common drain.

The p-channel MOSFET (MP8) has the power supply voltage Vdd supplied to the source thereof, the gate thereof is connected to the source of the p-channel MOSFET (MP4) and the drain thereof is connected to a first terminal of the resistor R2.

The square circuit 910 outputs the current Iout, which changes in a substantially square relationship with respect to the current Iin, from the drain of the p-channel MOSFET (MP8). The details of operation of the square circuit 910 will be described later.

An output driver circuit 920 is formed of the operational amplifier OP2, the current source Is2, the p-channel MOSFETs (MP9 and MP10) and the resistors R2 and R3. The output driver circuit 920 amplifies the current Iout up to the level that is required for the current I1 to be supplied to the bias circuits 430 to 432. In the case where the current Iout can be used as the current I1 without being amplified, the output driver circuit 920 need not be provided.

The current source Is2 outputs a constant current Ioff (offset current) to the first terminal of the resistor R2. The operational amplifier OP2 has a non-inverting input terminal thereof connected to the first terminal of the resistor R2, an inverting input terminal thereof connected to a first terminal of the resistor R3 and an output terminal thereof connected to the gate of the p-channel MOSFET (MP9). The p-channel MOSFET (MP9) has the power supply voltage Vdd supplied to the source thereof and has the drain thereof connected to the first terminal of the resistor R3. A second terminal of the resistor R3 is grounded. The p-channel MOSFET (MP10) has the power supply voltage Vdd supplied to the source thereof and has the gate thereof connected to the gate of the p-channel MOSFET (MP9).

If we denote the resistance value of the resistor R2 as R2 and the current that is output from the current source IS2 as Ioff, a voltage Va1 that is supplied to the non-inverting input terminal of the operational amplifier OP2 is (Iout+Ioff)×R2. The voltage at the first terminal of the resistor R3 is the voltage Va1 due to an imaginary short between the non-inverting input terminal and the inverting input terminal of the operational amplifier OP2. If we denote the resistance value of the resistor R3 as R3, a current Ia2 that flows to the p-channel MOSFET (MP9) is Va1/R3. Then, since the p-channel MOSFETs (MP9 and MP10) are connected to each other in a current mirroring manner, the current I1, which is output from the p-channel MOSFET (MP10), is a current obtained by amplifying the current Iout.

Next, the details of operation of the square circuit 910 will be described. The sizes of the p-channel MOSFETs (MP3 and MP4) are made to be the same and the sizes of the p-channel MOSFETs (MP5 and MP8) are made to be the same. Id1 denotes a current that flows through the n-channel MOSFET (MN2) and Id2 denotes a current that flows through the p-channel MOSFET (MP4). In addition, Iset denotes a current that is output from the current source Is1. Iset is constant, but it is assumed that Iset∝Iin for the purposes of this explanation. In addition, it is assumed that Id1=Id2. Under these conditions, Vramp∝Iin, Iin∝Id1 and Iset∝Id2.

Va denotes the drain voltage of the p-channel MOSFET (MP5), Vb denotes the drain voltage of the p-channel MOSFET (MP7) and Vc denotes the gate voltage of the p-channel MOSFET (MP4). In addition, Vgs3, Vgs4, Vgs5 and Vgs8 denote the gate-source voltages of the p-channel MOSFETs (MP3, MP4, MP5 and MP8), respectively.

Va=Vdd−Vgs5. In addition, Vc=Va−Vgs3 and Vb=Vc+Vgs4. Therefore, Vb=Vdd−Vgs5−Vgs3+Vgs4. Furthermore, since Vb=Vdd−Vgs8, Vdd−Vgs8=Vdd−Vgs5−Vgs3+Vgs4.

Figure 10:
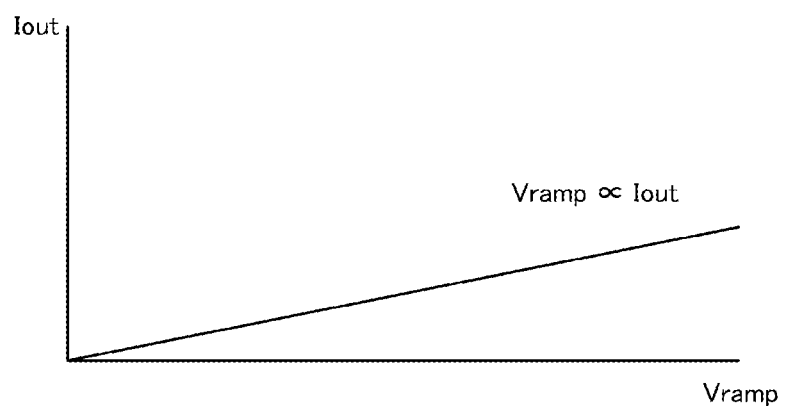
FIG. 10 illustrates an example a proportional relationship between a voltage and a current.

In the case where Id1=Id2, since Vgs3=Vgs4, Vgs5=Vgs8. Therefore, the p-channel MOSFETs (MP5 and MP8) form a pseudo current mirror circuit. Consequently, as illustrated in FIG. 10, the proportional relationship Vramp∝Iout holds true.

Figure 11:
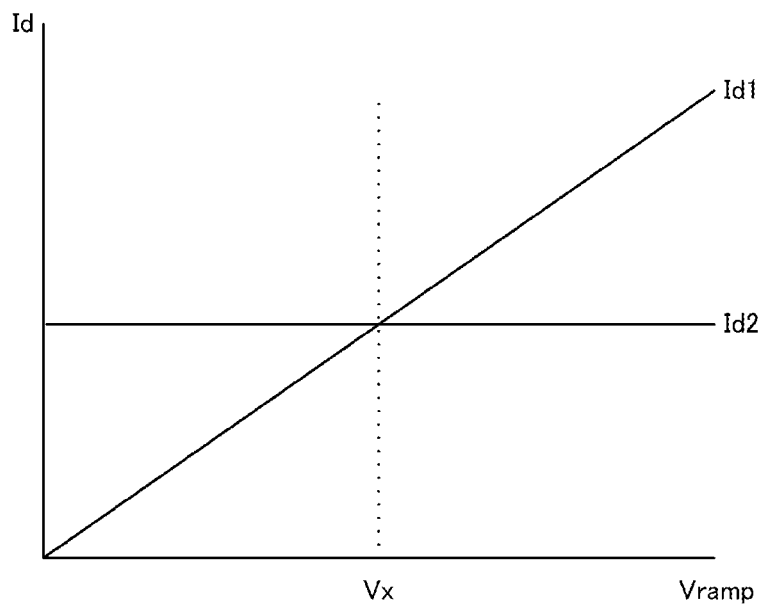
FIG. 11 illustrates an example of the relationship between currents in a square circuit.

However, in reality, as illustrated in FIG. 11, in the square circuit 910, Id1 is a current that is proportional to Vramp, but Id2 is a current (constant current) that is proportional to Iset. Therefore, in the square circuit 910 Id1 is not equal to Id2. In the square circuit 910, the current Iout is made to change by utilizing the mismatch between the current Id1 and the current Id2. This will be explained below.

Figure 12:
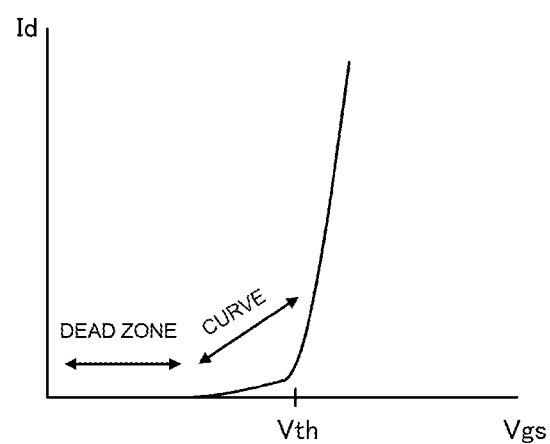
FIG. 12 illustrates an example of the relationship between a gate-source voltage and a drain current in a MOSFET.

First, a case where Id1<Id2 will be described. Vdd−Vgs8=Vdd−Vgs5−Vgs3+Vgs4 from the relationship between Va and Vb described above. Therefore, Vgs8=Vgs5+Vgs3−Vgs4. In the case where Id1<Id2, since Vgs3<Vgs4, Vgs8<Vgs5. Thus, Iout falls below the proportional relationship illustrated in FIG. 10. In the p-channel MOSFET (MP8), since there is a region in which Vgs6<a threshold voltage Vth, a curved characteristic appears between a dead zone and a non-linear region in Iout as illustrated in FIG. 12.

Next, a case in which Id1>Id2 will be described. As described above, Vgs8=Vgs5+Vgs3−Vgs4. In the case where Id1>Id2, since Vgs3>Vgs4, Vgs8>Vgs5. Thus, Iout exceeds the proportional relationship illustrated in FIG. 10.

Figure 8:
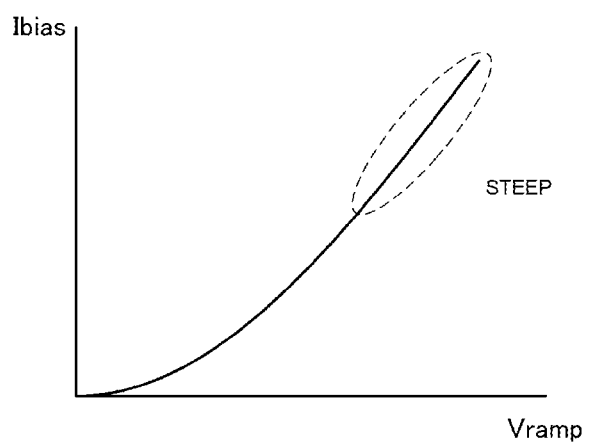
FIG. 8 illustrates an example of a bias current that changes in a substantially square relationship with respect to a voltage.
Figure 13:
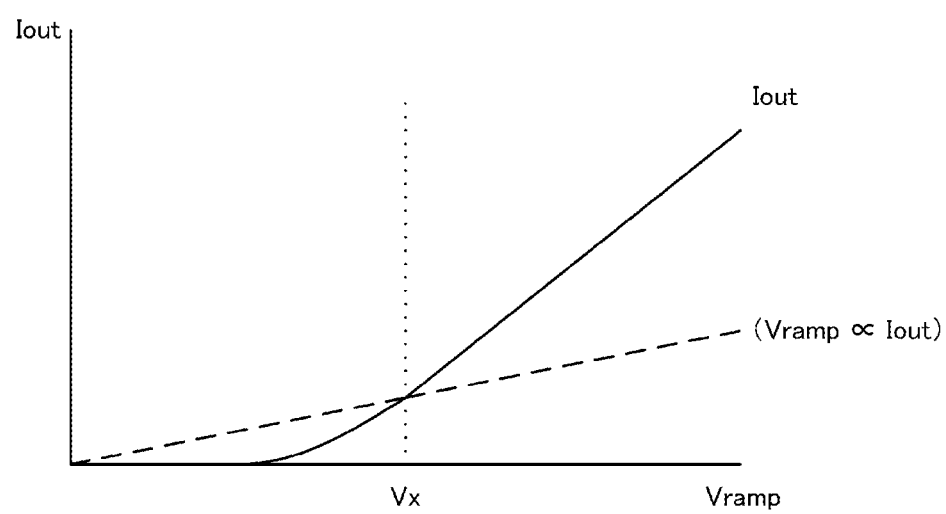
FIG. 13 illustrates an example of the characteristics of a current output from the square circuit.

Combining the case where Id1<Id2 and the case where Id1<Id2, the characteristics of Iout are as illustrated in FIG. 13. Thus, the current Iout output from the square circuit 910 is a current that changes in a substantially square relationship with respect to the voltage Vramp. The current I1 output from the current source 450 is a current obtained by amplifying the current Iout and therefore the current I1 is also a current that changes in a substantially square relationship with respect to the voltage Vramp. In other words, the rate of change of the current I1 in the case where the voltage Vramp is at a comparatively high level (second level) becomes larger than the rate of change of the current I1 in the case where the voltage Vramp is at a comparatively low level (first level). Therefore, as illustrated in FIG. 8, the rates of change of the bias currents Ibias1 to Ibias3 that are supplied to the amplifiers 400 to 402 can be made large in a region where the voltage Vramp is large. Thus, it is easy to perform slope control on a transmission signal as illustrated in FIG. 2.

Figure 14:
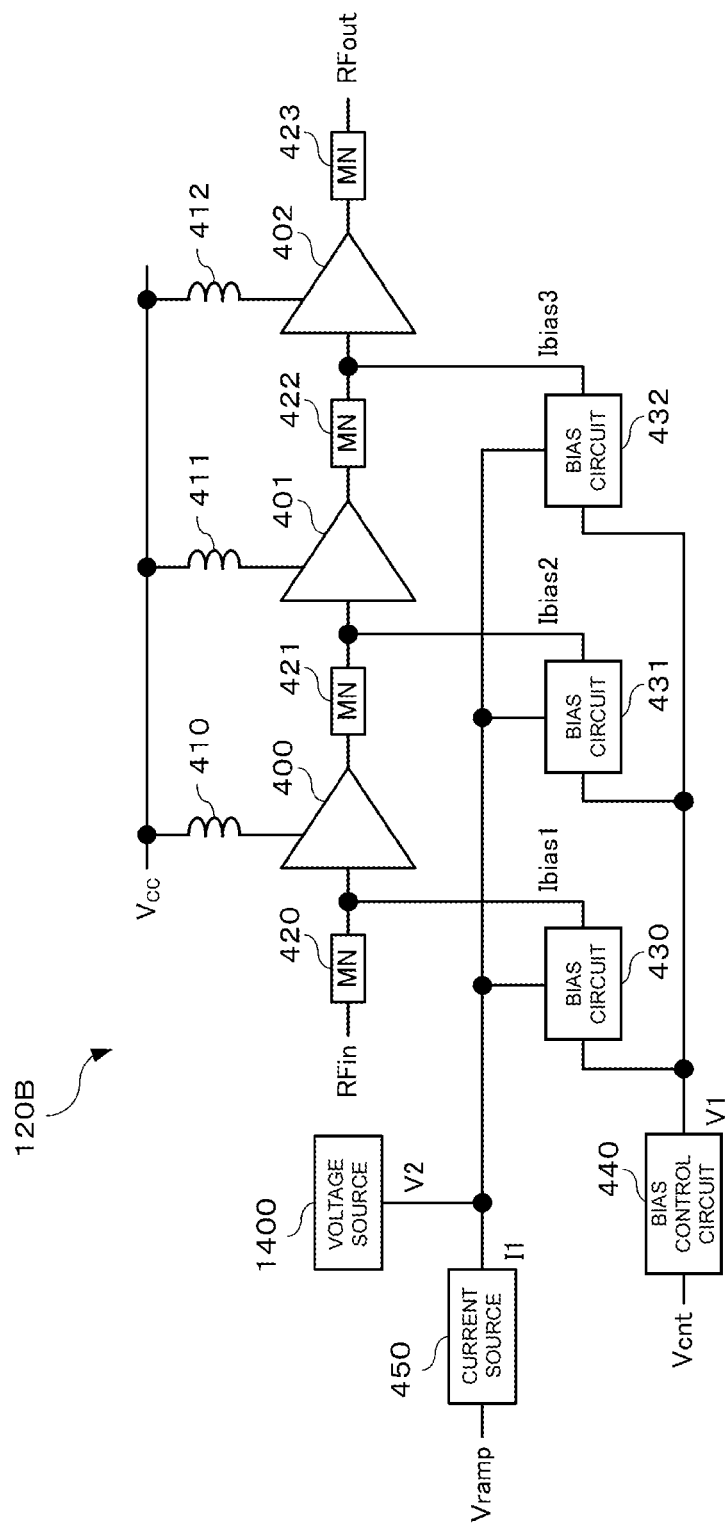
FIG. 14 illustrates the configuration of a power amplification module, which is an example of the power amplification module illustrated in FIG. 1.

FIG. 14 illustrates the configuration of a power amplification module 120B, which is an example of the power amplification module 120. Constituent elements that are the same as those of the power amplification module 120A illustrated in FIG. 4 are denoted by the same symbols and description thereof is omitted.

The power amplification module 120B includes a voltage source 1400 in addition to the elements included in the power amplification module 120A.

The voltage source 1400 (first voltage source) outputs a constant voltage V2 (first voltage) (for example, around 1.0 V). The voltage V2 output from the voltage source 1400 is supplied to the collectors of the transistors that form the bias circuits 430 to 432. The voltage V2 is at a level at which the amplifiers 400 to 402 do not operate.

Figure 15:
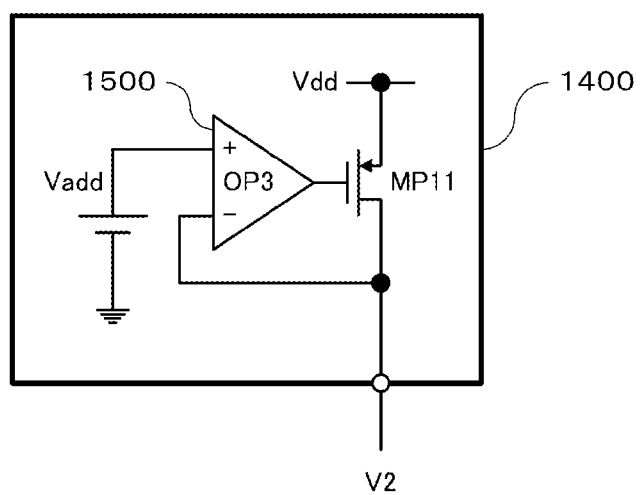
FIG. 15 illustrates an example of the configuration of a voltage source.

FIG. 15 illustrates an example of the configuration of the voltage source 1400. As illustrated in FIG. 15, the voltage source 1400 includes an operational amplifier OP3 and a p-channel MOSFET (MP11).

The operational amplifier OP3 has a constant voltage Vadd (for example, around 1.0 V) supplied to a non-inverting input terminal thereof, an inverting input terminal thereof is connected to the drain of the p-channel MOSFET (MP11) and an output terminal thereof is connected to the gate of the p-channel MOSFET (MP11). The voltage V2 is output from the drain of the p-channel MOSFET (MP11). In the voltage source 1400, the voltage V2 is controlled by the voltage Vadd through an imaginary short circuit between the non-inverting input terminal and the inverting input terminal of the operational amplifier OP3.

As described above, in the power amplification module 120B, the voltage V2 (for example, around 1.0 V) output from the voltage source 1400 is supplied to the bias circuits 430 to 432. Parasitic capacitance and bypass capacitors can be charged by the voltage V2. Therefore, the response time for the voltage Vramp after starting slope control of the transmission signal can be shortened. The p-channel MOSFET (MP11) may be replaced with an n-channel MOSFET.

Figure 16:
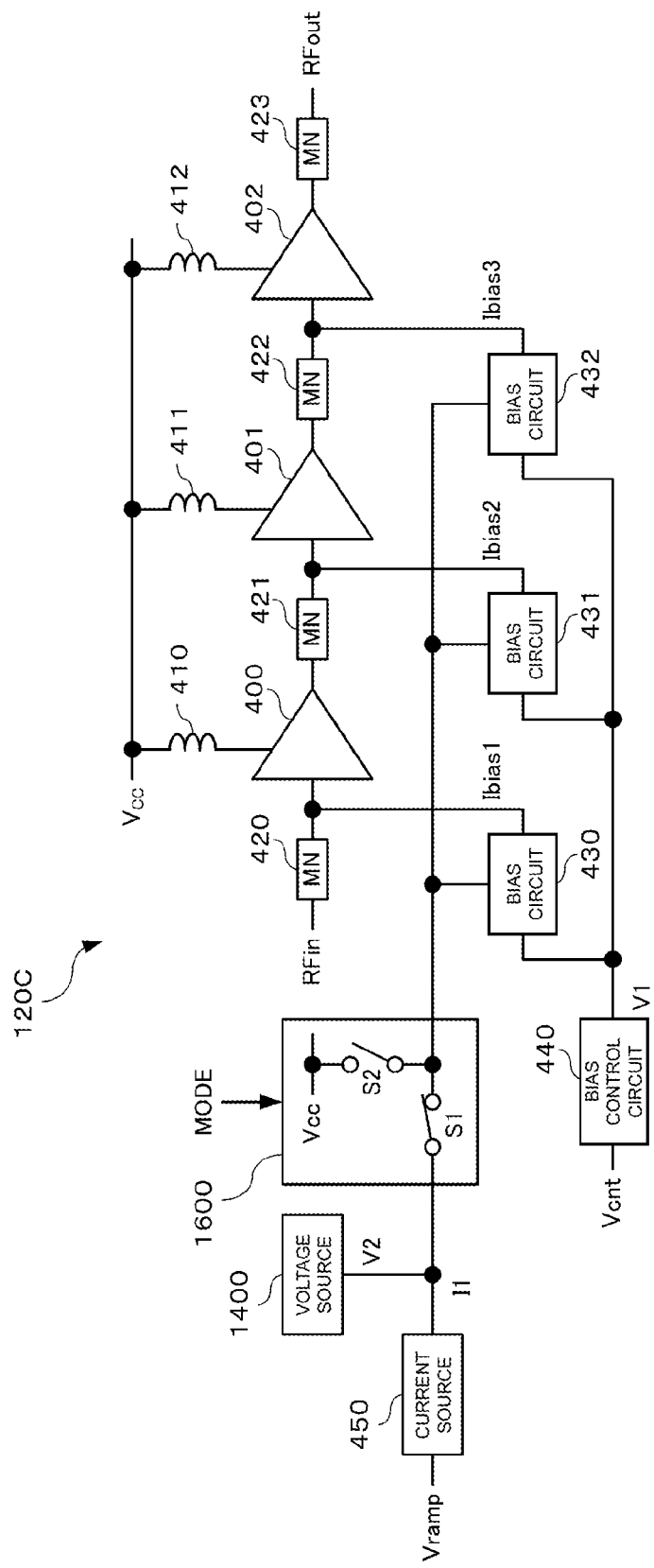
FIG. 16 illustrates the configuration of a power amplification module, which is an example of the power amplification module illustrated in FIG. 1.

FIG. 16 illustrates the configuration of a power amplification module 120C, which is an example of the power amplification module 120. Constituent elements that are the same as those of the power amplification module 120B illustrated in FIG. 14 are denoted by the same symbols and description thereof is omitted.

The power amplification module 120C includes a switch circuit 1600 in addition to the elements included in the power amplification module 120B. The switch circuit 1600 (first switch circuit) outputs the current I1 from the current source 450 or the power supply voltage Vcc to the bias circuits 430 to 432 on the basis of a mode signal MODE.

The mode signal MODE indicates a GSM operation mode (first operation mode) in which the bias currents Ibias1 to Ibias3 are controlled in accordance with the voltage Vramp or an EDGE operation mode (second operation mode) in which the bias currents Ibias1 to Ibias3 are not controlled in accordance with the voltage Vramp.

In the case of the GSM operation mode, the switch circuit 1600 outputs the current I1 from the current source 450. In the case of the EDGE operation mode, the switch circuit 1600 outputs the power supply voltage Vcc. Thus, the power amplification module 120C can support the EDGE mode. In addition, the power amplification module 120C need not include the voltage source 1400.

Figure 17:
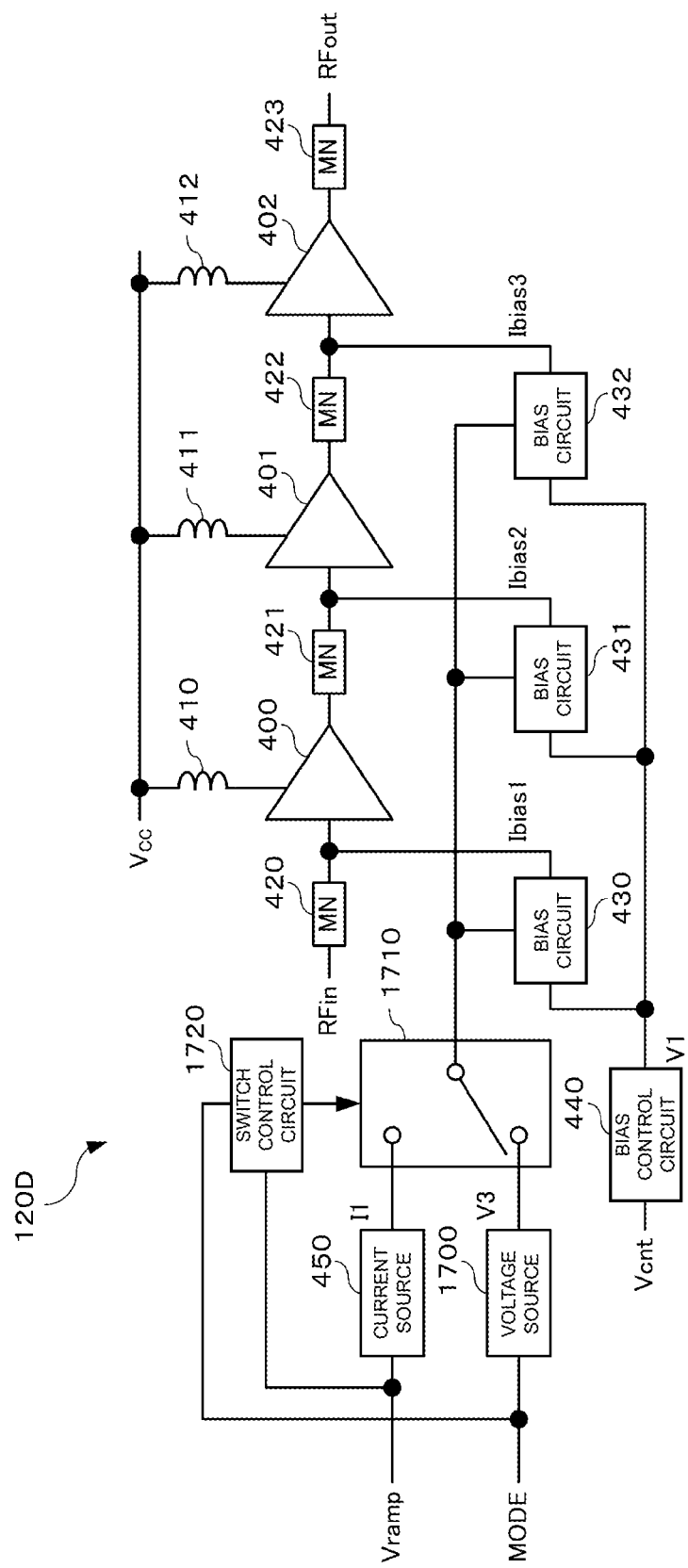
FIG. 17 illustrates the configuration of a power amplification module, which is an example of the power amplification module illustrated in FIG. 1.

FIG. 17 illustrates the configuration of a power amplification module 120D, which is an example of the power amplification module 120. Constituent elements that are the same as those of the power amplification module 120A illustrated in FIG. 4 are denoted by the same symbols and description thereof is omitted.

The power amplification module 120D includes a voltage source 1700, a switch circuit 1710 and a switch control circuit 1720 in addition to the elements included in the power amplification module 120A.

The voltage source 1700 (second voltage source) outputs a voltage V3. The voltage V3 output from the voltage source 1700 changes in accordance with the mode signal MODE. In the case of the GSM mode, the voltage source 1700 outputs a constant voltage V3 (second voltage) (for example, around 1.0 V). In the case of the EDGE mode, the voltage source 1700 outputs a constant voltage V3 (third voltage) that is higher than that in the case of the GSM mode.

The switch circuit 1710 (second switch circuit) supplies the current I1 output from the current source 450 or the voltage V3 output from the voltage source 1700 to the bias circuits 430 to 432 on the basis of control performed by the switch control circuit 1720.

The switch control circuit 1720 controls the switch circuit 1710 on the basis of the mode signal MODE and the voltage Vramp.

In the case of the EDGE mode, the switch control circuit 1720 controls the switch circuit 1710 such that the voltage V3 (for example, power supply voltage Vcc) output from the voltage source 1700 is supplied to the bias circuits 430 to 432. Thus, the power amplification module 120D can support the EDGE mode. In the case of the GSM mode, the switch control circuit 1720 controls the switch circuit 1710 in accordance with the voltage Vramp. Specifically, in the case where the voltage Vramp is smaller than a prescribed level (for example, 0.2 V), the switch control circuit 1720 controls the switch circuit 1710 such that the voltage V3 (for example, around 1.0 V) output from the voltage source 1700 is supplied to the bias circuits 430 to 432. In addition, in the case where the voltage Vramp is larger than a prescribed level, the switch control circuit 1720 controls the switch circuit 1710 such that the current I1 output from the current source 450 is supplied to the bias circuits 430 to 432.

As described above, in the case of the GSM mode, when the voltage Vramp is smaller than the prescribed threshold, the voltage V3 (for example, around 1.0 V) output from the voltage source 1700 is supplied to the bias circuits 430 to 432. Parasitic capacitances and bypass capacitors can be charged by the voltage V3 before starting the slope control of the transmission signal. Therefore, the response time for the voltage Vramp after starting slope control of the transmission signal can be shortened. The voltage V3 at this time is at level at which the amplifiers 400 to 402 do not operate.

Figure 18:
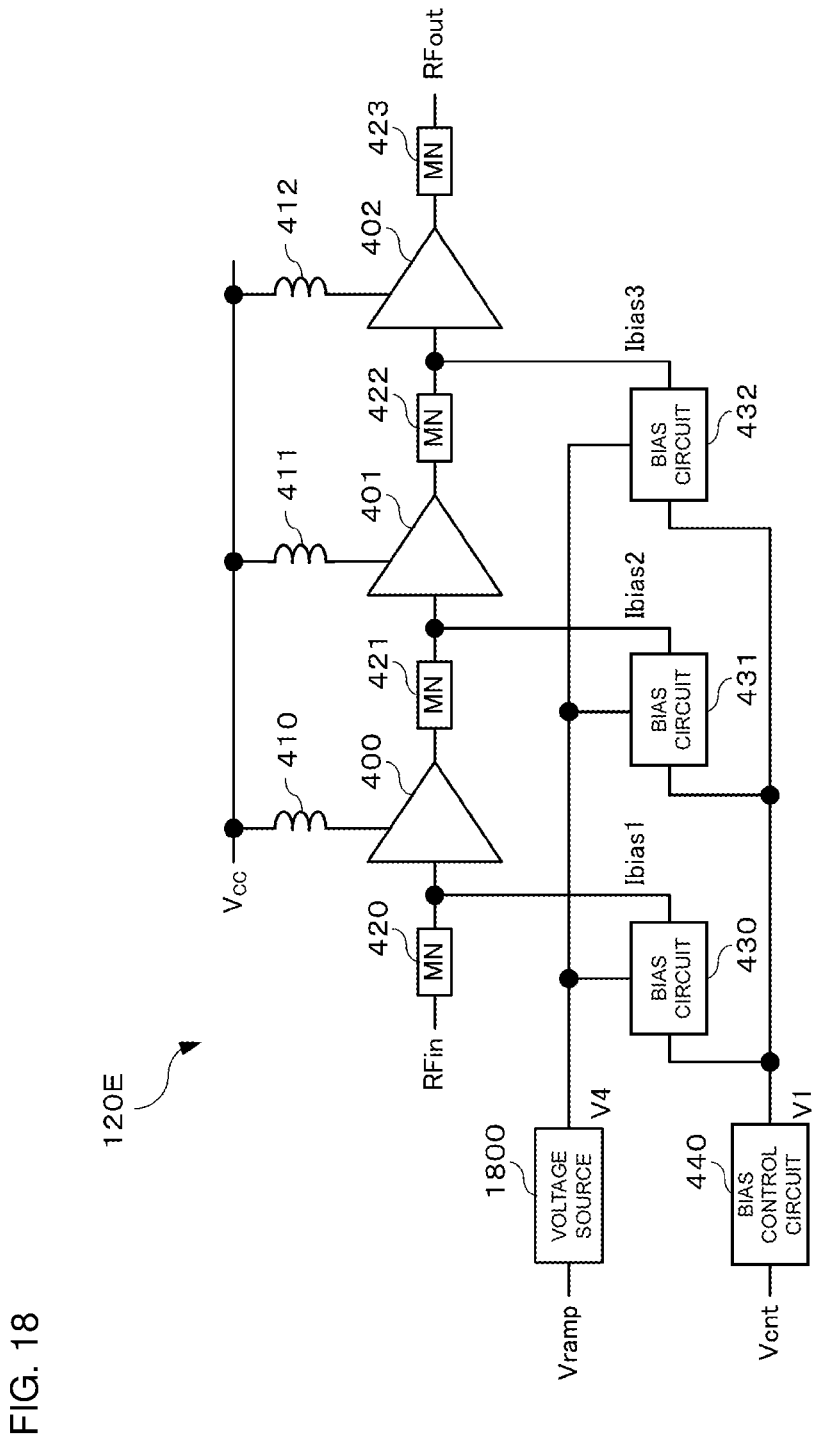
FIG. 18 illustrates the configuration of a power amplification module, which is an example of the power amplification module illustrated in FIG. 1.

FIG. 18 illustrates the configuration of a power amplification module 120E, which is an example of the power amplification module 120. Constituent elements that are the same as those of the power amplification module 120A illustrated in FIG. 4 are denoted by the same symbols and description thereof is omitted.

The power amplification module 120E includes a voltage source 1800 instead of the current source 450 of the power amplification module 120A. The voltage source 1800 (third voltage source) outputs a voltage V4 (fourth voltage) on the basis of the voltage Vramp. The voltage V4 is supplied to the collector of the transistor 600 that forms the bias circuit 430.

The voltage V4 is similarly supplied to the bias circuits 431 and 432. In the power amplification module 120E, the gains of the amplifiers 400 to 402 are controlled by the voltage V4 being controlled in accordance with the voltage Vramp. The transmission signal is subjected to slope control as a result of the gains of the amplifiers 400 to 402 being controlled.

Figure 19:
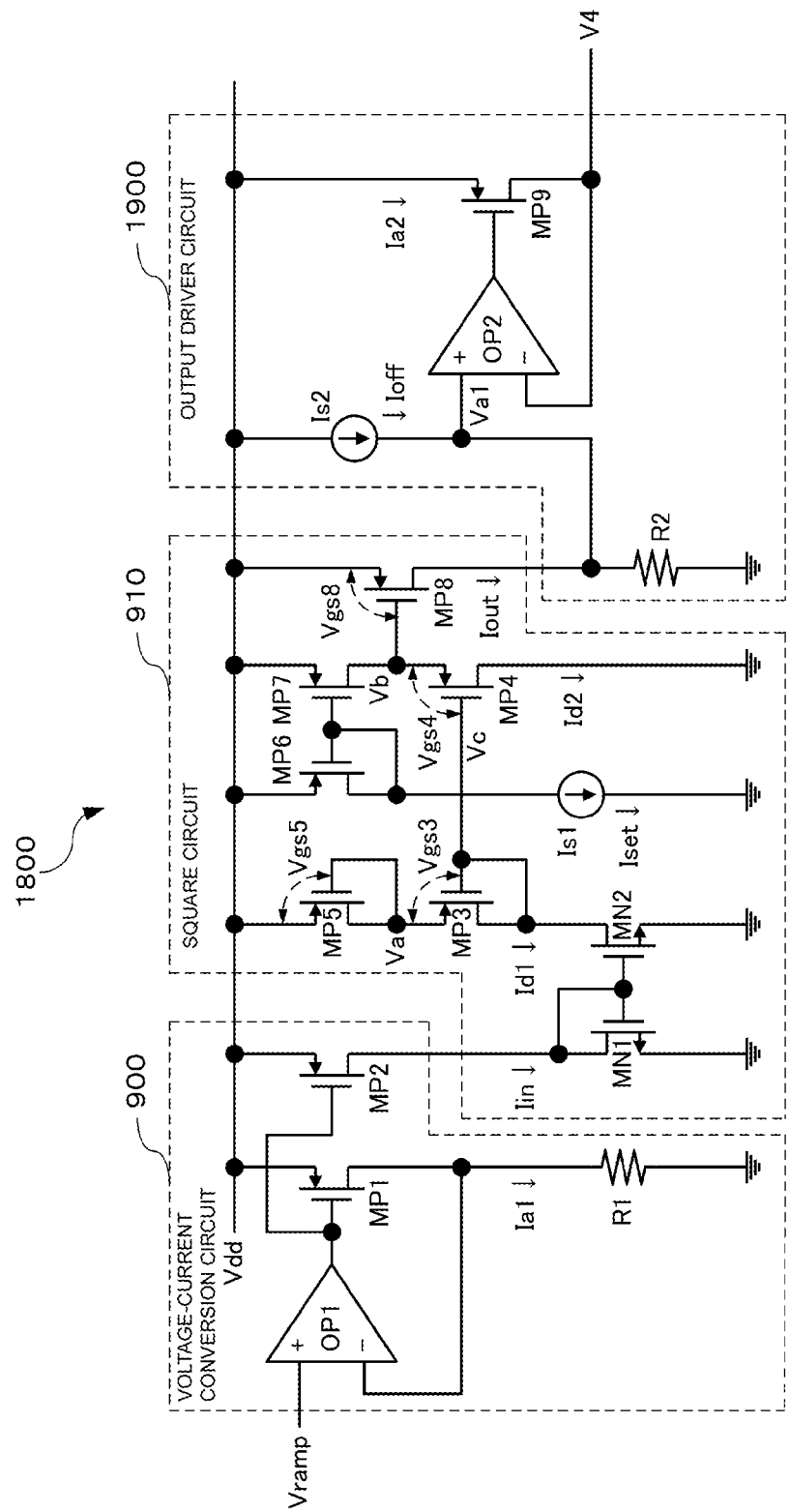
FIG. 19 illustrates an example of the configuration of a voltage source.

FIG. 19 illustrates an example of the configuration of the voltage source 1800. Elements that are the same as those of the current source 450 illustrated in FIG. 9 are denoted by the same symbols and description thereof is omitted.

The voltage source 1800 includes an output driver circuit 1900 instead of the output driver circuit 920 of the current source 450. The output driver circuit 1900 has the same configuration as the output driver circuit 920 except that the output driver circuit 1900 does not include the p-channel MOSFET (MP10) and the resistor R3 of the output driver circuit 920.

As described in the description of the current source 450, the voltage Va1 supplied to the non-inverting input terminal of the operational amplifier OP2 is (Iout+Ioff)×R2. In addition, the current Iout is a current that corresponds to the voltage Vramp. Therefore, the voltage V4 (=Va1) of the inverting output terminal of the operational amplifier OP2 is a voltage that corresponds to the voltage Vramp. Then, since the current Iout changes in a substantially square relationship with respect to the voltage Vramp, the voltage V4 also changes in a substantially square relationship with respect to the voltage Vramp.

Figure 20:
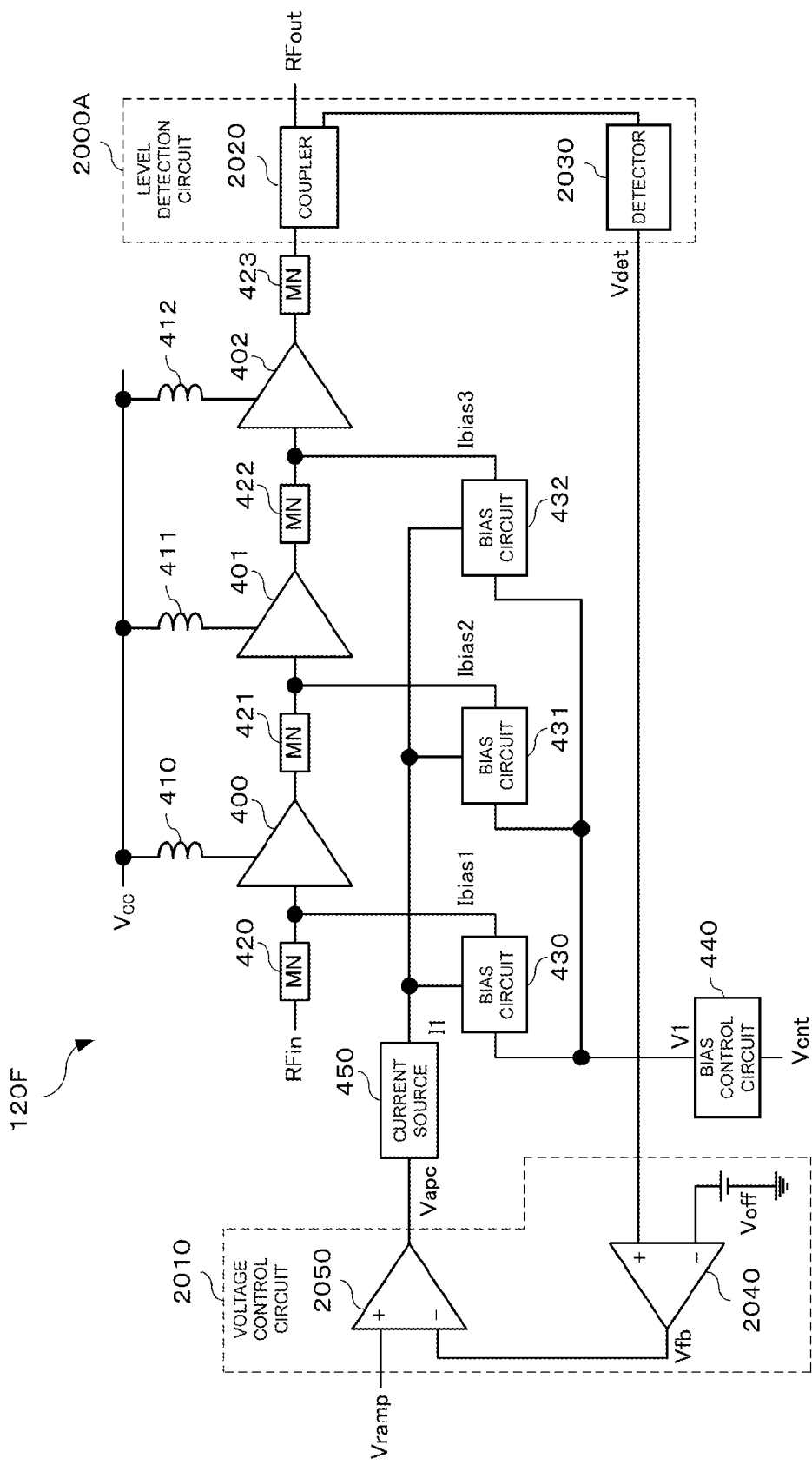
FIG. 20 illustrates the configuration of a power amplification module, which is an example of the power amplification module illustrated in FIG. 1.

FIG. 20 illustrates the configuration of a power amplification module 120F, which is an example of the power amplification module 120. Constituent elements that are the same as those of the power amplification module 120A illustrated in FIG. 4 are denoted by the same symbols and description thereof is omitted.

The power amplification module 120F includes a level detection circuit 2000A and a voltage control circuit 2010 in addition to the elements included in the power amplification module 120A.

The level detection circuit 2000A is a circuit that outputs a detected voltage Vdet that corresponds to the amplified signal RFout. In the configuration illustrated in FIG. 20, the level detection circuit 2000A includes a coupler 2020 and a detector 2030.

The coupler 2020 extracts and then outputs part of the amplified signal RFout output from the amplifier 402. The detector 2030 detects the signal extracted by the coupler 2020, converts the extracted signal into a voltage and inputs the voltage to the voltage control circuit 2010. The detected voltage Vdet output from the detector 2030 has a level that corresponds to the amplified signal RFout.

The voltage control circuit 2010 is a circuit that controls a voltage Vapc (level control voltage) on the basis of the voltage Vramp (reference voltage) and the detected voltage Vdet. In the configuration illustrated in FIG. 20, the voltage control circuit 2010 includes a differential amplifier 2040 and an error amplifier 2050.

The differential amplifier 2040 amplifies the difference between the detected voltage Vdet input to the non-inverting input terminal thereof and an offset voltage Voff input to the inverting input terminal thereof and outputs a voltage Vfb. The level of the detected voltage Vdet input to the non-inverting input terminal corresponds to the level of the amplified signal RFout and therefore the level of the voltage Vfb also corresponds to the level of the amplified signal RFout.

The error amplifier 2050 outputs the voltage Vapc (level control voltage) obtained by amplifying the difference (error) between the voltage Vramp input to the non-inverting input terminal thereof and the voltage Vfb input to the inverting input terminal thereof. The current source 450 outputs the current I1 corresponding to the voltage Vapc.

In the power amplification module 120F, the level detection circuit 2000A and the voltage control circuit 2010 form a feedback circuit that controls the voltage Vapc (level control voltage) such that the amplified signal RFout comes to have a level that corresponds to the voltage Vramp (reference voltage). Thus, variations in gain caused by changes in the power supply voltage, the temperature, the output load and so forth can be suppressed by using the feedback circuit. A feedback circuit may be similarly added to the power amplification modules 120B to 120E as well.

In addition, although the configuration for the case of a 3-stage amplifier is depicted in the power amplification module 120F illustrated in FIG. 20, the same configuration as in FIG. 20 can be also adopted for the output of the final-stage amplifier in configurations where there is a different number of stages. The same is true for the other level detection circuits 2000B to 2000E described below.

Figure 21:
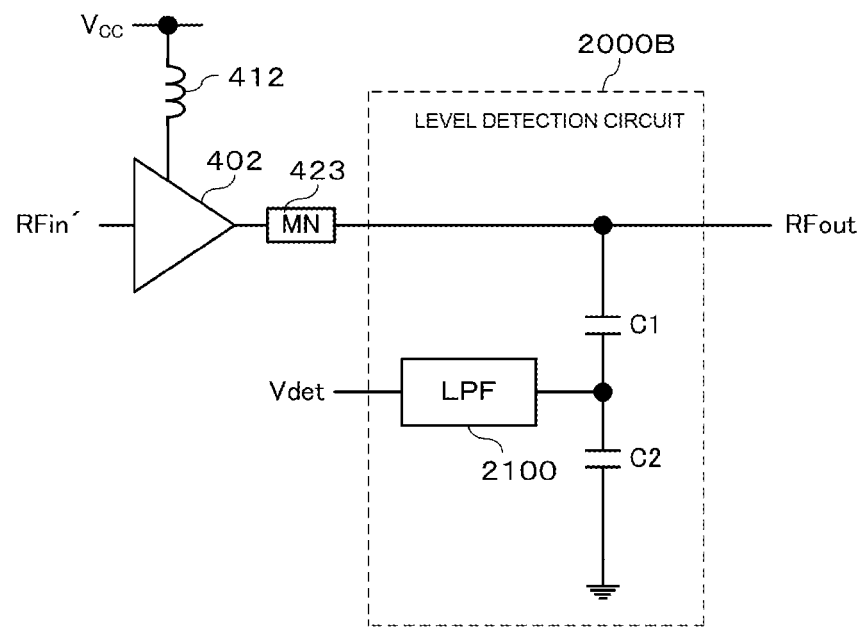
FIG. 21 illustrates the configuration of a level detection circuit, which is a modification of the level detection circuit illustrated in FIG. 20.

FIG. 21 illustrates the configuration of a level detection circuit 2000B, which is a modification of the level detection circuit 2000A. Constituent elements that are the same as those of the power amplification module 120F illustrated in FIG. 20 are denoted by the same symbols and description thereof is omitted. In addition, an RF signal input to the amplifier 402 is denoted as RFin'.

As illustrated in FIG. 21, the level detection circuit 2000B includes capacitors C1 and C2 and a low pass filter (LPF) 2100.

One end of the capacitor C1 is connected to one end of the matching network 423 and the other end of the capacitor C1 is connected to one end of the capacitor C2. The other end of the capacitor C2 is grounded. The amplified signal RFout is supplied to the one end of the capacitor C1. Thus, the voltage at the connection point between the capacitors C1 and C2 is at a level that corresponds to the signal level of the amplified signal RFout.

One end of the low pass filter 2100 is connected to a connection point between the capacitors C1 and C2 and the low pass filter 2100 outputs the detected voltage Vdet from the other end thereof. The low pass filter 2100 smooths and then outputs the voltage generated at the connection point between the capacitors C1 and C2. For example, the low pass filter 2100 can be formed by using a resistor and a capacitor, for example.

In the level detection circuit 2000B, a detected voltage Vdet that corresponds to the signal level of the amplified signal RFout is output by detecting the voltage at the connection point between the capacitors C1 and C2. Therefore, in this configuration as well, a feedback circuit can be formed that controls the voltage Vapc (level control voltage) such that the amplified signal RFout comes to have a level that corresponds to the voltage Vramp (reference voltage).

Figure 22:
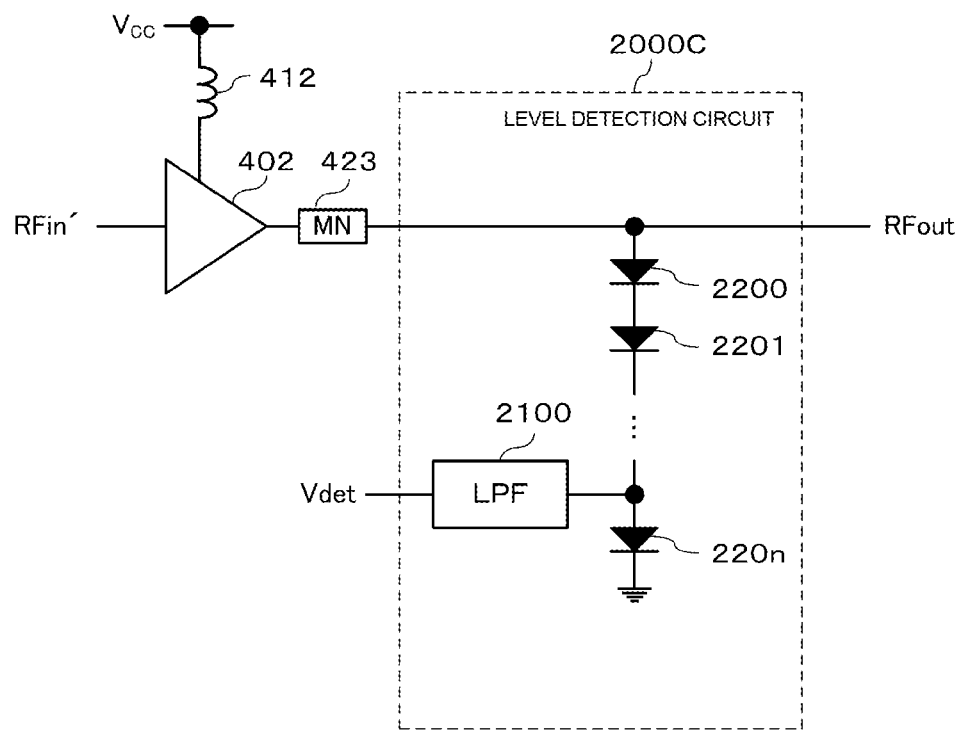
FIG. 22 illustrates the configuration of a level detection circuit, which is a modification of the level detection circuit illustrated in FIG. 20.

FIG. 22 illustrates the configuration of a level detection circuit 2000C, which is another modification of the level detection circuit 2000A. Constituent elements that are the same as those of the power amplification module 120F illustrated in FIG. 20 are denoted by the same symbols and description thereof is omitted.

As illustrated in FIG. 22, the level detection circuit 2000C includes n diodes 2200, 2201, . . . , 220n and a low pass filter 2100.

The diodes 2200, 2201, . . . 220n are connected in series with one another. The amplified signal RFout is supplied to the anode of the diode 2200 and the cathode of the diode 220n is grounded. Transistors, which each have the collector and the base thereof connected to each other (diode connected), may be used instead of the diodes 2200, 2201, . . . 220n.

One end of the low pass filter 2100 is connected between any of the diodes 2200, 2201, . . . 220n and the low pass filter 2100 outputs the detected voltage Vdet from the other end thereof. In the example illustrated in FIG. 22, the one end of the low pass filter 2100 is connected to the anode of the diode 220n that is closest to the ground, but the position at which the one end of the low pass filter 2100 is connected is not limited to this.

In the level detection circuit 2000C, a detected voltage Vdet that corresponds to the signal level of the amplified signal RFout is output by detecting the voltage between any of the diodes. Therefore, in this configuration as well, a feedback circuit can be formed that controls the voltage Vapc (level control voltage) such that the amplified signal RFout comes to have a level that corresponds to the voltage Vramp (reference voltage). The number (n) of diodes can be appropriately chosen in accordance with the range of the signal level of the amplified signal RFout.

Figure 23:
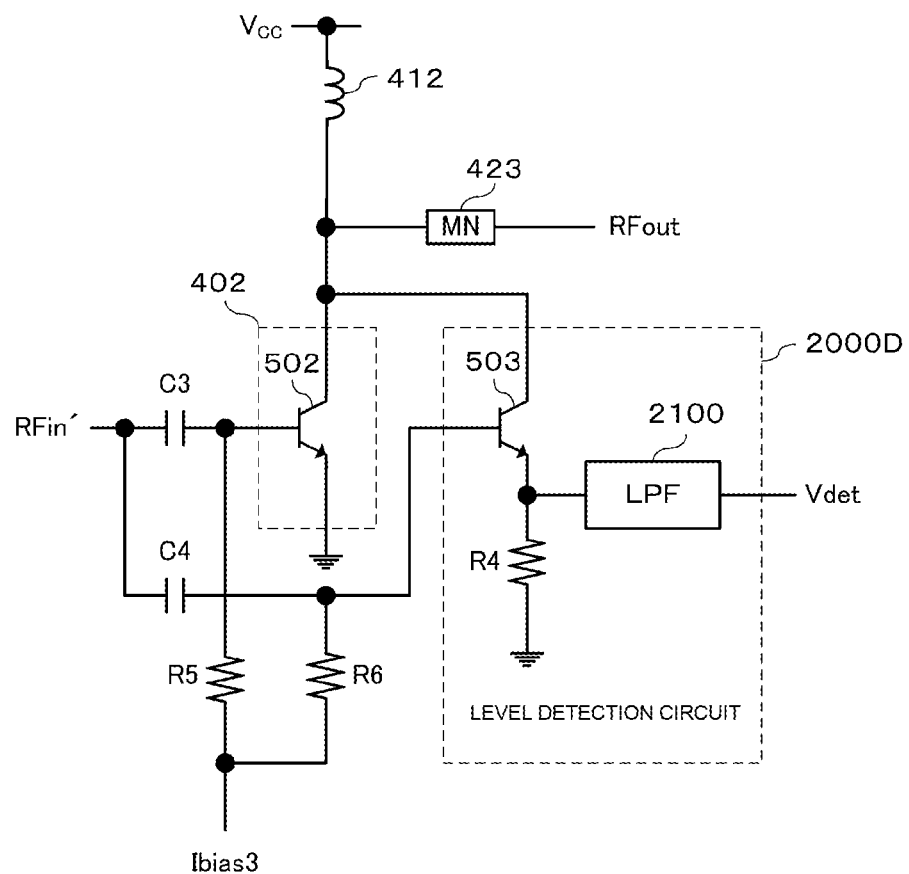
FIG. 23 illustrates the configuration of a level detection circuit, which is a modification of the level detection circuit illustrated in FIG. 20.

FIG. 23 illustrates the configuration of a level detection circuit 2000D, which is another modification of the level detection circuit 2000A. Constituent elements that are the same as those of the power amplification module 120F illustrated in FIG. 20 are denoted by the same symbols and description thereof is omitted.

As illustrated in FIG. 23, the level detection circuit 2000D includes a transistor 503, a resistor R4 and a low pass filter 2100.

The amplifier 402 includes a transistor 502 similarly to the amplifier 400 illustrated in FIG. 5. A RF signal RFin' is input to the base of the transistor 502 via a capacitor C3. In addition, a bias current Ibias3 is supplied to the base of the transistor 502 via a resistor R5. The transistor 503 is replica circuit that is provided in order to detect the signal level of the amplified signal RFout that flows to the collector of the transistor 502. The collector of the transistor 503 is connected to the collector of the transistor 502 and the emitter of the transistor 503 is grounded (has a common emitter) via the resistor R4. The RF signal RFin' is input to the base of the transistor 503 via a capacitor C4. In addition, the bias current Ibias3 is supplied to the base of the transistor 503 via a resistor R6. The transistor 503 can be made to have a smaller size than the transistor 502. For example, in the case where the transistors are formed using a plurality of unit transistors (fingers), the number of fingers of the transistor 502 can be made to be N (>1) and the number of fingers of the transistor 503 can be made to be 1.

Here, the RF signal RFin' is divided between the transistors 502 and 503 in accordance with the capacitance ratio between the capacitors C3 and C4. In addition, the resistors R5 and R6 adjust the bias currents supplied to the bases of the transistors 502 and 503 on the basis of the bias current Ibias3. The resistance values of the resistors R5 and R6 can be chosen so that the transistors 502 and 503 come to have the same current densities. Thus, currents of sizes that correspond to the ratio between the sizes of the transistors 502 and 503 can be supplied to the transistors 502 and 503. In other words, the current that flows through the transistor 503 has a size that corresponds to the signal level of the amplified signal RFout.

The resistor R4 is a resistor (detection resistor) that is provided in order to detect the current that flows to the transistor 503 and is provided between the emitter of the transistor 503 and the ground. The resistance value of the resistor R4 may be around several ohms, for example.

One end of the low pass filter 2100 is connected to the emitter of the transistor 503 and the low pass filter 2100 outputs the detected voltage Vdet from the other end thereof.

As described above, the level detection circuit 2000D can supply to the transistor 503 a current that corresponds to the current that flows through the transistor 502. A voltage that corresponds to the signal level of the amplified signal RFout can be detected by changing the current output from the emitter of the transistor 503 into a voltage using the resistor R4. Furthermore, by making the transistor 503 that forms the replica circuit smaller than the transistor 502, power loss can be suppressed compared with a configuration where the current that flows to the transistor 502 is directly measured. In this configuration as well, a feedback circuit can be formed that controls the voltage Vapc (level control voltage) such that the amplified signal RFout comes to have a level that corresponds to the voltage Vramp (reference voltage).

Figure 24:
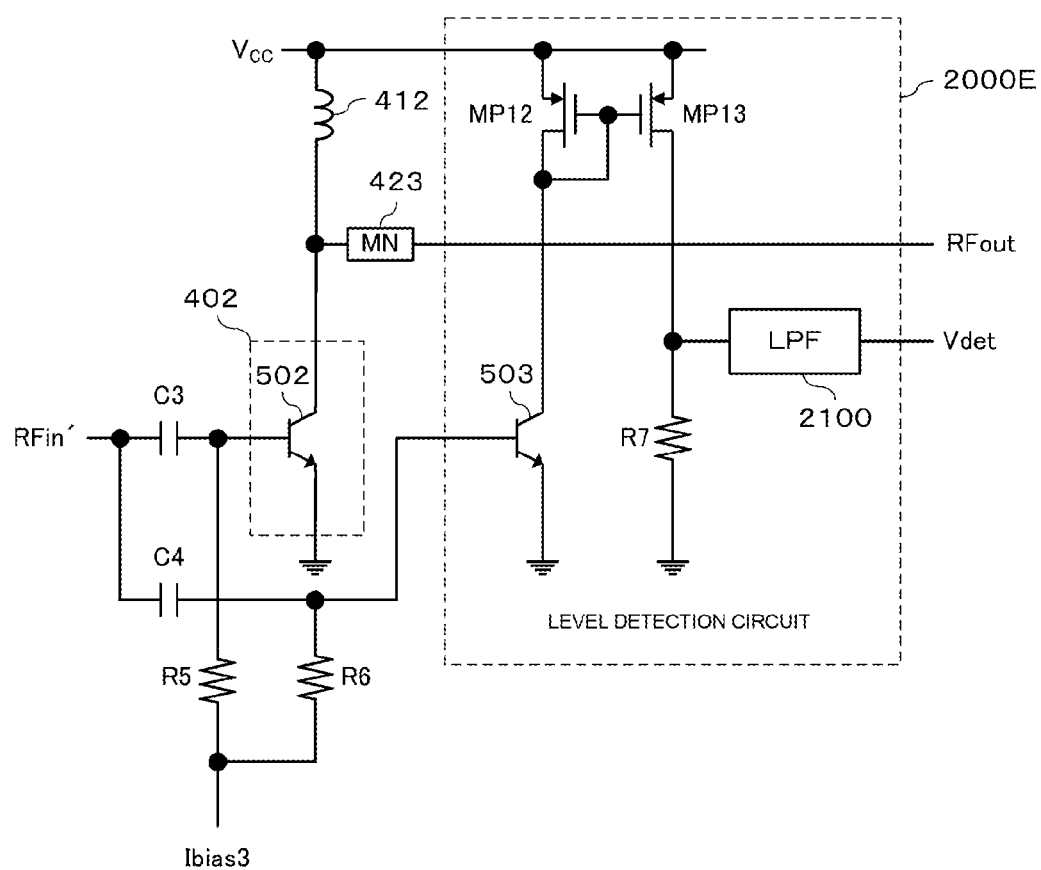
FIG. 24 illustrates the configuration of a level detection circuit, which is a modification of the level detection circuit illustrated in FIG. 20.

FIG. 24 illustrates the configuration of a level detection circuit 2000E, which is another modification of the level detection circuit 2000A. Constituent elements that are the same as those of the power amplification module 120F illustrated in FIG. 20 are denoted by the same symbols and description thereof is omitted.

As illustrated in FIG. 24, the level detection circuit 2000E includes the transistor 503, p-channel MOSFETs (MP12 and MP13), a resistor R7 and the low pass filter 2100.

The transistor 503 forms a replica circuit that replicates the transistor 502 similarly to as in the above-described level detection circuit 2000D. The collector of the transistor 503 is connected to the drain of the p-channel MOSFET (MP12). The transistor 503 has a common emitter. The configuration of the base of the transistor 503 is the same as in the level detection circuit 2000D and therefore detailed description thereof is omitted here.

The p-channel MOSFETs (MP12 and MP13) are connected to each other in a current mirroring manner. Specifically, the p-channel MOSFET (MP12) has the power supply voltage Vcc supplied to the source thereof, the gate thereof is connected to the drain thereof and the drain thereof is connected to the collector of the transistor 503. The p-channel MOSFET (MP13) has the power supply voltage Vdd supplied to the source thereof, the gate thereof is connected to the gate of the p-channel MOSFET (MP12) and the drain thereof is connected to the resistor R7.

The resistor R7 is a resistor (detection resistor) that is provided in order to detect the current that flows to the p-channel MOSFET (MP13) and is provided between the drain of the p-channel MOSFET (MP13) and the ground.

One end of the low pass filter 2100 is connected to the drain of the p-channel MOSFET (MP13) and the low pass filter 2100 outputs the detected voltage Vdet from the other end thereof.

In the level detection circuit 2000E, a current that corresponds to the current that flows through the transistor 502 flows to the transistor 503, similarly to as in the level detection circuit 2000D. Furthermore, as a result of the p-channel MOSFETs (MP12 and MP13) being connected to each other in a current mirroring manner, the current that flows through the p-channel MOSFET (MP13) has a size that corresponds to the current that flows through the p-channel MOSFET (MP12). Therefore, the current that flows through the p-channel MOSFET (MP13) has a size that corresponds to the current that flows through the transistor 502. Thus, a detected voltage Vdet that corresponds to the signal level of the amplified signal RFout is output.

Therefore, in this configuration as well, a feedback circuit can be formed that controls the voltage Vapc (level control voltage) such that the amplified signal RFout comes to have a level that corresponds to the voltage Vramp (reference voltage).

Exemplary embodiments of the present disclosure have been described above. In the power amplification modules 120A and 120B, the current I1 output from the current source 450 is supplied to the collectors of the transistors that form the bias circuits 430 to 432. A transmission signal is subjected to slope control by controlling the current I1 in accordance with the voltage Vramp. Thus, with the power amplification modules 120A and 120B, a transmission signal can be subjected to slope control without the use of a LDO regulator. Therefore, an increase in circuit scale can be suppressed compared with the case where an LDO regulator is used.

Furthermore, in the power amplification modules 120A to 120D, the current I1 changes in a substantially square relationship with respect to the voltage Vramp. Thus, the bias currents Ibias1 to Ibias3 can be made to change as illustrated in FIG. 8. Therefore, as illustrated in FIG. 2, it is easy to control the level of the transmission signal so that the change in the level is not too steep in a region where the transmission signal rises and to control the level of the transmission signal so that the change in the level is not too gentle in the region where the transmission signal falls.

In the power amplification modules 120A to 120B, the current I1 changes in a substantially square relationship with respect to the voltage Vramp, but the current I1 is not limited to changing in this type relationship so long as the current I1 changes in response to the voltage Vramp. For example, the current I1 may change in a substantially third power or higher relationship with respect to the voltage Vramp. In addition, the current I1 may change in a substantially proportional relationship with respect to the voltage Vramp, for example.

In addition, in the power amplification module 120B, a constant voltage V2 (for example, around 1.0 V) is supplied to the bias circuits 430 to 432. Parasitic capacitances and bypass capacitors can be charged by the voltage V2. Therefore, the response time for the voltage Vramp after starting slope control of the transmission signal can be shortened.

Furthermore, in the power amplification module 120C, the switch circuit 1600 outputs the current I1 from the current source 450 in the case of the GSM operation mode and outputs the power supply voltage Vcc in the case of the EDGE operation mode. Thus, the power amplification module 120C can support the EDGE mode.

In addition, in the power amplification module 120D, the voltage V3 (for example, around 1.0 V) is supplied to the bias circuits 430 to 432 in the case where the voltage Vramp is smaller than a prescribed level (for example, 0.2 V) and the current I1 that corresponds to the voltage Vramp is supplied to the bias circuits 430 to 432 in the case where the voltage Vramp is larger than a prescribed level (for example 0.2 V). Thus, parasitic capacitances and bypass capacitors can be charged before starting the slope control of the transmission signal. Therefore, the response time for the voltage Vramp after starting slope control of the transmission signal can be shortened.

Furthermore, in the power amplification module 120D, the voltage V3 (for example, power supply voltage Vcc) output from the voltage source 1700 is supplied to the bias circuits 430 to 432 in the case of the EDGE mode. Thus, the EDGE mode can be supported.

In addition, in the power amplification module 120E, the voltage V4 output from the voltage source 1800 is supplied to the collectors of the transistors that form the bias circuits 430 to 432. A transmission signal is subjected to slope control by controlling the voltage V4 in accordance with the voltage Vramp. Thus, with the power amplification module 120E, a transmission signal can be subjected to slope control without the use of a LDO regulator. Therefore, an increase in circuit scale can be suppressed compared with the case where an LDO regulator is used.

In addition, in the power amplification module 120E, the voltage V4 changes in a substantially square relationship with respect to the voltage Vramp. Thus, the bias currents Ibias1 to Ibias3 can be made to change as illustrated in FIG. 8. Therefore, as illustrated in FIG. 2, it is easy to control the level of the transmission signal so that the change in the level is not too steep in a region where the transmission signal rises and to control the level of the transmission signal so that the change in the level is not too gentle in the region where the transmission signal falls.

In the power amplification module 120E, the voltage V4 changes in a substantially square relationship with respect to the voltage Vramp, but the voltage V4 is not limited to changing in this type relationship so long as the voltage V4 changes in response to the voltage Vramp. For example, the voltage V4 may change in a substantially third power or higher relationship with respect to the voltage Vramp. In addition, the voltage V4 may change in a substantially proportional relationship with respect to the voltage Vramp, for example.

Furthermore, in the power amplification module 120F, the detected voltage Vdet that corresponds to the signal level of the amplified signal RFout is output from the level detection circuit 2000A and the voltage Vapc that corresponds to the detected voltage Vdet is output from the voltage control circuit 2010. Thus, feedback control is performed such that the voltage Vapc input to the current source 450 comes to have a level that corresponds to the amplified signal RFout. Thus, with the power amplification module 120F, variations in gain caused by changes in the power supply voltage, the temperature, the output load and so forth can be suppressed.

The purpose of the embodiments described above is to enable easy understanding of the present disclosure and the embodiments are not to be interpreted as limiting the present disclosure. The present disclosure can be changed or improved without departing from the gist of the disclosure and equivalents to the present disclosure are also included in the present disclosure. In other words, appropriate design changes made to the embodiments by a person skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   an amplification transistor that has a constant power supply voltage supplied to a collector of the amplification transistor, that has a bias current supplied to a base of the amplification transistor and that amplifies an input signal input to the base of the amplification transistor and outputs an amplified signal from the collector of the amplification transistor;
   a first current source that outputs a first current that corresponds to a level control voltage that controls a signal level of the amplified signal; and
   a bias transistor that has the first current supplied to a collector of the bias transistor, a bias control voltage connected to a base of the bias transistor and that outputs the bias current from an emitter of the bias transistor,
   wherein the first current source comprises a voltage-current conversion circuit, a square circuit, and an output driver circuit.

2. The power amplification module according to claim 1, wherein when the level control voltage is at a second level, a rate of change of the first current is larger than a rate of change of the first current when the level control voltage is at a first level, the second level being higher than the first level.

3. The power amplification module according to claim 1, further comprising:
   a first voltage source that supplies a constant first voltage to the collector of the bias transistor.

4. The power amplification module according to claim 2, further comprising:
   a first voltage source that supplies a constant first voltage to the collector of the bias transistor.

5. The power amplification module according to claim 1, further comprising:
   a level detection circuit that outputs a detected voltage that corresponds to the signal level of the amplified signal; and
   a voltage control circuit that controls the level control voltage on the basis of a reference voltage and the detected voltage.

6. The power amplification module according to claim 5, wherein the voltage control circuit controls the level control voltage on the basis of the reference voltage and the detected voltage such that the signal level of the amplified signal comes to have a value that corresponds to the reference voltage.

7. The power amplification module according to claim 3, further comprising:
   a level detection circuit that outputs a detected voltage that corresponds to the signal level of the amplified signal; and
   a voltage control circuit that controls the level control voltage on the basis of a reference voltage and the detected voltage.

* * * * *